United States Patent
Kosugi et al.

(10) Patent No.: US 7,367,005 B2
(45) Date of Patent: Apr. 29, 2008

(54) METHOD AND APPARATUS FOR DESIGNING A LAYOUT, AND COMPUTER PRODUCT

(75) Inventors: Kazuyuki Kosugi, Kawasaki (JP); Ikuko Murakawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 455 days.

(21) Appl. No.: 11/024,482

(22) Filed: Dec. 30, 2004

(65) Prior Publication Data
US 2005/0283750 A1    Dec. 22, 2005

(30) Foreign Application Priority Data
Jun. 16, 2004    (JP)    ............... 2004-178107

(51) Int. Cl.
*G06F 17/50*    (2006.01)
(52) U.S. Cl. ............................ 716/10; 716/6
(58) Field of Classification Search ............ None
See application file for complete search history.

(56) References Cited

U.S. PATENT DOCUMENTS

| | | | | |
|---|---|---|---|---|
| 6,145,116 A * | 11/2000 | Tawada | ............... | 716/6 |
| 6,754,877 B1 * | 6/2004 | Srinivasan | ............... | 716/2 |
| 6,832,180 B1 * | 12/2004 | Sutera et al. | ............... | 703/13 |
| 6,907,586 B1 * | 6/2005 | Al-Dabagh et al. | ............... | 716/5 |
| 6,907,590 B1 * | 6/2005 | Al-Dabagh et al. | ............... | 716/6 |
| 7,013,253 B1 * | 3/2006 | Cong et al. | ............... | 703/14 |
| 7,073,140 B1 * | 7/2006 | Li et al. | ............... | 716/4 |
| 7,137,093 B2 * | 11/2006 | Harn | ............... | 716/10 |
| 2004/0158421 A1 * | 8/2004 | Iwanishi | ............... | 702/69 |

FOREIGN PATENT DOCUMENTS

JP    2003-281212    10/2003

* cited by examiner

*Primary Examiner*—Leigh M. Garbowski
(74) *Attorney, Agent, or Firm*—Staas & Halsey LLP

(57) ABSTRACT

An arranging unit arranges a cell obtained from a net list input by an input unit on a large scale integration chip. A net extracting unit extracts an arbitrary net to be tested from a set of the cells arranged. An information extracting unit extracts, based on correlation information between information on a driving capacity of each of cells included in a circuit created based on a delay time caused by a crosstalk occurred as a result of a circuit simulation for a predetermined circuit model and information on a length of a wiring that connects the cells, wire-length information that has a correlation with information on the driving capacity of the cell in the net. An inserting unit inserts, based on the wire-length information, a delay-time suppressing cell to suppress a delay time in the net.

19 Claims, 12 Drawing Sheets

FIG.5

| INTERNAL RESISTANCE RD[Ω] | WIRE LENGTH L [MM] | SLEW RATE SLEW [PSEC] | CROSSTALK DELAY TIME [PSEC] |
|---|---|---|---|
| 0 | 2.2 | 200 | 50 |
| 100 | 2.0 | 200 | 50 |
| 200 | 1.8 | 200 | 50 |
| 300 | 1.6 | 200 | 50 |
| ⋮ | ⋮ | ⋮ | ⋮ |
| 600 | 1.0 | 200 | 50 |
| 800 | 0.8 | 200 | 50 |
| 1200 | 0.5 | 200 | 50 |
|  |  |  |  |

METHOD AND APPARATUS FOR DESIGNING A LAYOUT, AND COMPUTER PRODUCT

CROSS-REFERENCE TO RELATED APPLICATIONS

This application is based upon and claims the benefit of priority from the prior Japanese Patent Application No. 2004-178107, filed on Jun. 16, 2004, the entire contents of which are incorporated herein by reference.

BACKGROUND OF THE INVENTION

1) Field of the Invention

The present invention relates to a layout designing apparatus, a layout designing method, and a layout designing program for designing a large-scale-integrated (LSI) chip, suppressing a delay time caused by a crosstalk.

2) Description of the Related Art

Conventionally, increase of work efficiency in an LSI design by shortening a design period is demanded. Particularly, for an LSI that requires large-scale, high performance, high-speed, and low-power consumption, it is important to increase the work efficiency in designing work to maintain a high quality.

Therefore, conventionally in the LSI design, an amount of crosstalk that occurs between nets wired adjacent to each other is calculated and analyzed after routing a wiring. A buffer is applied to resolve the crosstalk error to the nets in which the crosstalk error occurs (conventional technology 1).

The crosstalk error is also corrected by rearranging a part of wirings that are arranged in parallel instead of applying the buffer (conventional technology 2).

Furthermore, the crosstalk error is prevented by arranging the wiring in such a manner that the wiring has a wire length that is less likely to be influenced by the crosstalk. In other words, when the wiring is arranged, a wire length that is likely to cause the crosstalk error is avoided in advance in a process performed manually, and an extra number of relay buffers are arranged in the wiring during logic designing (conventional technology 3).

Data of cell arrangement is obtained after automatically arranging the wiring. Then, a length of a parallel wiring that is formed by connecting temporary wirings in a manhattan length path between cell terminals in an identical node is determined before automatically arranging a wiring between the cells. The crosstalk error in a parallel wiring that is longer in length than a predetermined length is detected. The crosstalk is corrected by rearranging the cells that are arranged closely at intervals within a predetermined value, and that are connected to a temporary wiring in which the crosstalk is detected, or by applying the buffer (conventional technology 4). Such a technology is disclosed in, for example, Japanese Patent Application Laid-Open No. 2003-281212.

However, in the above conventional technology 1, the buffer is applied to reduce the crosstalk error in a certain area in which the crosstalk error is detected after automatically routing the wiring. Therefore, if there is no space for arranging the buffer in the area, it is necessary to route the wring from a beginning. Thus, turn around time (TAT) increases.

Moreover, in the above conventional technology 2, the crosstalk error is detected after automatically routing the wiring, and the wiring in an area in which the crosstalk error occurs is rerouted to reduce the crosstalk error. If the wiring is congested in the area, it is necessary to reroute the wiring from the beginning because a short circuit may be caused in the area with another wiring that has been routed in the area. Thus, the TAT increases.

Furthermore, in the conventional technology 3, an extra process is required manually during designing a wiring layout to avoid the crosstalk error. Therefore, a great number of work procedures are required. In addition, it is necessary to consider a floor plan even from a stage of the logic designing. Thus, designing becomes complicated due to such limits in designing, and the number of required procedures increases.

Moreover, in the conventional technology 4, the crosstalk error is detected after automatically routing the wiring to correct the crosstalk error. If the wiring is congested in an area in which the crosstalk error is detected, or if there is no space left for the buffer in the area, it is impossible to apply the buffer or rearrange the cells. Therefore, it is necessary to rearrange the cells from the beginning. As a result, the TAT increases.

In addition, even if the crosstalk error is corrected in an area by applying the buffer or by rearranging the cells, this causes delay in a net that is interactively connected to the area. Moreover, mountability of the layout decreases.

SUMMARY OF THE INVENTION

It is an object of the present invention to solve at least the above problems in the conventional technology.

A layout designing apparatus according to one aspect of the present invention includes an net-list input unit that receives an input of an arbitrary net list: an arranging unit that arranges a cell obtained from the net list input by the net-list input unit on a large-scale-integration chip; a net extracting unit that extracts an arbitrary net to be tested from a set of the cells arranged; a storing unit that stores correlation information indicating a correlation between first information and second information, the first information being on a driving capacity of each of cells included in a circuit model that is created based on a delay time caused by a crosstalk occurred as a result of a circuit simulation for a predetermined circuit model, the second information being on a wire length of a wiring that connects the cells in the circuit model; an information extracting unit that extracts, based on the correlation information stored in the storing unit, first wire-length information that has a correlation with information on the driving capacity of the cell in the net extracted by the net extracting unit; and an inserting unit that inserts, based on the first wire-length information, a delay-time suppressing cell to suppress a delay time in the net.

A layout designing method according to another aspect of the present invention includes receiving an input of an arbitrary net list: arranging a cell obtained from the net list input by the net-list input unit on a large-scale-integration chip; extracting an arbitrary net to be tested from a set of the cells arranged; a storing unit that stores correlation information indicating a correlation between first information and second information, the first information being on a driving capacity of each of cells included in a circuit model that is created based on a delay time caused by a crosstalk occurred as a result of a circuit simulation for a predetermined circuit model, the second information being on a wire length of a wiring that connects the cells in the circuit model; extracting, based on the correlation information indicating a correlation between first information and second information, first wire-length information that has a correlation with information on the driving capacity of the cell in the net extracted by the net extracting unit, the first information being on a driving capacity of each of cells included in a circuit model that is created based on a delay time caused by a crosstalk occurred as a result of a circuit simulation for a predetermined circuit model, the second information being on a wire length of a wiring that connects the cells in the circuit model; and inserting, based on the first wire-length information, a delay-time suppressing cell to suppress a delay time in the net.

A computer-readable recording medium according to still another aspect of the present invention stores a layout designing program that causes a computer to execute the above layout designing method according to the present invention.

The other objects, features, and advantages of the present invention are specifically set forth in or will become apparent from the following detailed description of the invention when read in conjunction with the accompanying drawings.

BRIEF DESCRIPTION OF THE DRAWINGS

FIG. 5 is a correlation table of the internal resistance, a wire length (information) of an aggressor line, and a slew rate of a victim net;

DETAILED DESCRIPTION

Exemplary embodiments of a layout designing apparatus, a layout designing method, and a layout designing program according to the present invention are explained in detail with reference to the accompanying drawings. The method and the apparatus for designing a layout according to embodiments below may be implemented with, for example, a computer-aided design (CAD) that stores a layout designing program according to the embodiments.

Figure 1:
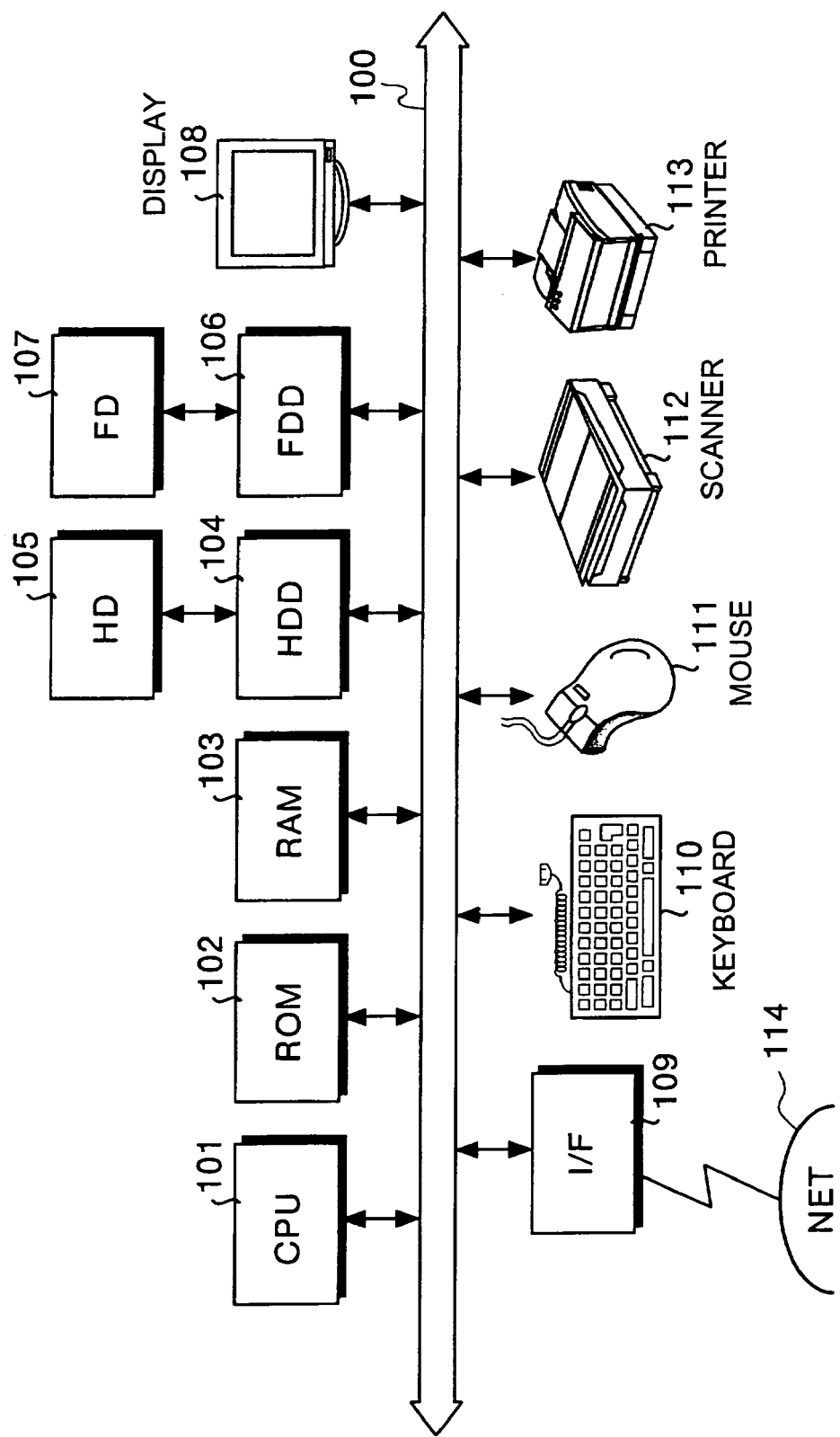
FIG. 1 is a schematic of a hardware configuration of a layout designing apparatus according to an embodiment of the present invention.

FIG. 1 is a schematic of a hardware configuration of the layout designing apparatus according to the embodiment of the present invention. As shown in FIG. 1, the layout designing apparatus includes a central processing unit (CPU) 101, a read-only memory (ROM) 102, a random access memory (RAM) 103, a hard disk drive (HDD) 104, a hard disk (HD) 105, a flexible disk drive (FDD) 106, a flexible disk (FD) 107 as an example of a detachable recording medium, a display 108, an interface (I/F) 109, a keyboard 110, a mouse 111, a scanner 112, and a printer 113. Each of components is connected through a bus 100.

The CPU 101 controls a whole system of the layout designing apparatus. The ROM 102 stores a computer program such as a boot program. The RAM 103 is used as a work area of the CPU 101. The HDD 104 controls read/write of data from/to the HD 105 in accordance with a control of the CPU 101. The HD 105 stores the data written by a control of the HDD 104.

The FDD 106 controls read/write of data from/to the FD 107 in accordance with a control of the HDD 101. The FD 107 stores the data written by the control of the FDD 106, and allows the layout designing apparatus to read the data stored in the FD 107.

As the detachable recording medium, a compact disk-read-only memory (CD-ROM that includes a compact disk-recordable (CD-R) and a compact disk-rewritable (CD-RW)), a magneto optical disk (MO), a digital versatile disk (DVD), and a memory card may be used other than the FD 107. The display 108 displays a cursor, an icon, a tool box, and data such as a document, an image, and functional information. The display 108 may be, for example, a cathode-ray tube (CRT), a thin-film transistor (TFT) liquid-crystal display, and a plasma display.

The I/F 109 is connected to a network 114 such as the Internet through a communication line and is connected to other devices via the network 114. The I/F 109 controls the network 114 and an internal interface to control input/output of data from external devices. The I/F 109 may be, for example, a modem or a local area network (LAN) adapter.

The key board 110 includes keys for inputting characters, numbers, and various instructions, and is used to input data. The key board 110 may be a touch-panel input pad or a numerical key pad. The mouse 111 is used to shift the cursor, select a range, shift windows, and change sizes. A track ball or a joy stick may be used as a pointing device if similar functions are provided.

The scanner 112 reads an image optically and captures image data into the layout designing apparatus. The scanner 112 may be provided with an optical character read (OCR) function. The printer 113 prints the image data and document data. The printer 113 may be a laser printer and an inkjet printer.

Figure 2:
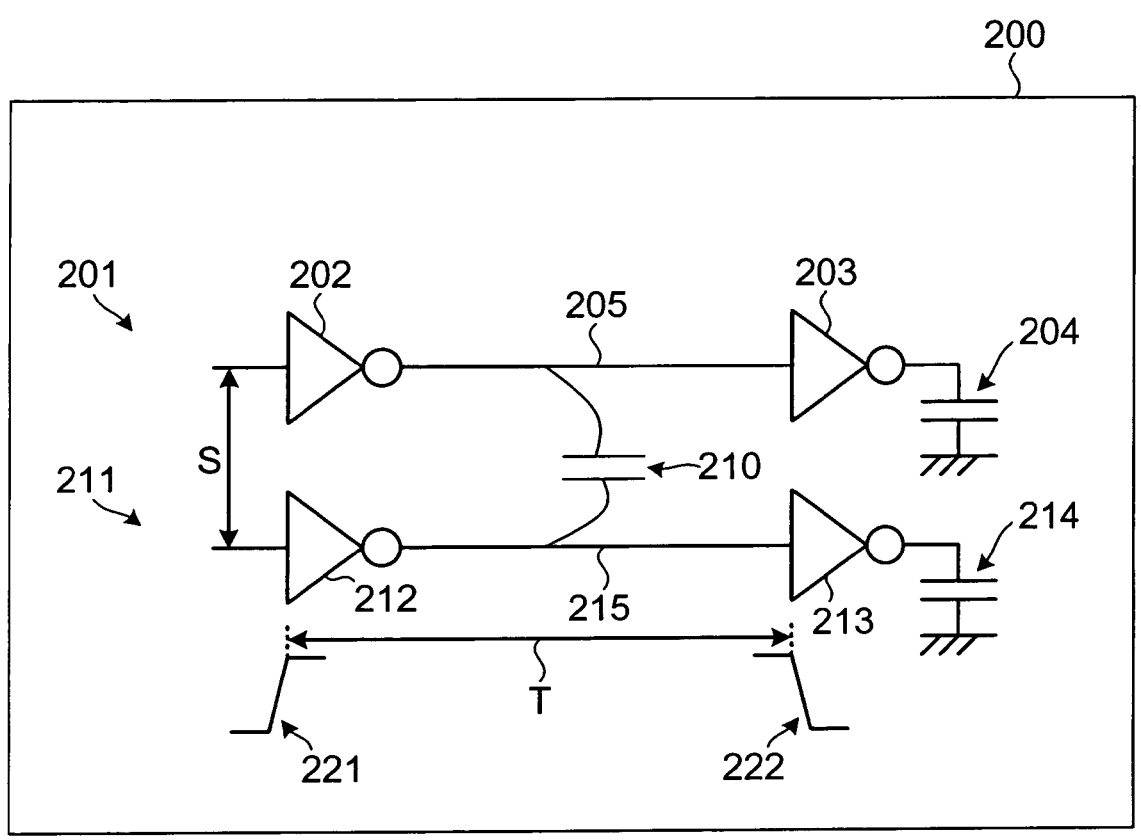
FIG. 2 is a schematic of a circuit model in which a crosstalk occurs.

FIG. 2 is a schematic of a circuit model in which the crosstalk occurs. As shown in FIG. 2, a circuit model 200 includes an aggressor net 201 and a victim net 211. The crosstalk occurs in the aggressor net 201, and the victim net 211 is affected by the crosstalk.

The aggressor net 201 includes a driver cell 202, a receiver cell 203, and a load capacity 204 that are connected in series. An inverter is applied to the driver cell 202 as an example, and the driver cell 202 outputs a transmission signal to the receiver cell 203. The inverter is also applied to the receiver cell 203 as an example, and inputs the transmission signal from the driver cell 202. The load capacity 204 is grounded. An aggressor line 205 that has a predetermined wire length is arranged between the driver cell 202 and the receiver cell 203. The aggressor line 205 transmits the transmission signal, and connects an output terminal of the driver cell 202 and an input terminal of the receiver cell 203.

Similarly to the aggressor net 201, the victim net 211 includes a driver cell 212, a receiver cell 213, and a load capacity 214 that are connected in series. An inverter is applied to the driver cell 212 as an example, and the driver cell 212 outputs a transmission signal to the receiver cell 213. The inverter is also applied to the receiver cell 213 as an example, and inputs the transmission signal from the driver cell 212. The load capacity 214 is grounded. A victim line 215 that has a predetermined wire length is arranged between the driver cell 212 and the receiver cell 213. The victim line 215 transmits the transmission signal, and connects an output terminal of the driver cell 212 and an input terminal of the receiver cell 213. The wire lengths of the aggressor line 205 and the victim line 215 are same.

A capacity 210 is generated between the aggressor net 201 and the victim net 211 depending on a wiring interval S between the aggressor line 205 and the victim line 215. The capacity 210 is a factor of the crosstalk that occurs in the aggressor net 201. A waveform of a noise signal 221 that is generated in the driver cell 212 and a waveform of a noise signal 222 that is generated in the receiver cell 213 when the transmission signal is applied to the aggressor net 201 are shown in FIG. 2.

A value that indicates rapid changes in rising and falling of the noise signals 221 and 222 are slew rates of the driver cell 212 and the receiver cell 213 respectively. A time interval T between the rising of the noise signal 221 and the falling of the noise signal 222 is a delay time (hereinafter, "crosstalk delay time") that is caused due to the crosstalk that occurs in the aggressor net 201. Therefore, the crosstalk delay time is determined based on a driving capacity of the driver cell 202, a value of the capacity 210, the wiring interval S, the wire length of the victim line 215 (or the wire length of the aggressor line 205), and the slew rate.

Figure 3:
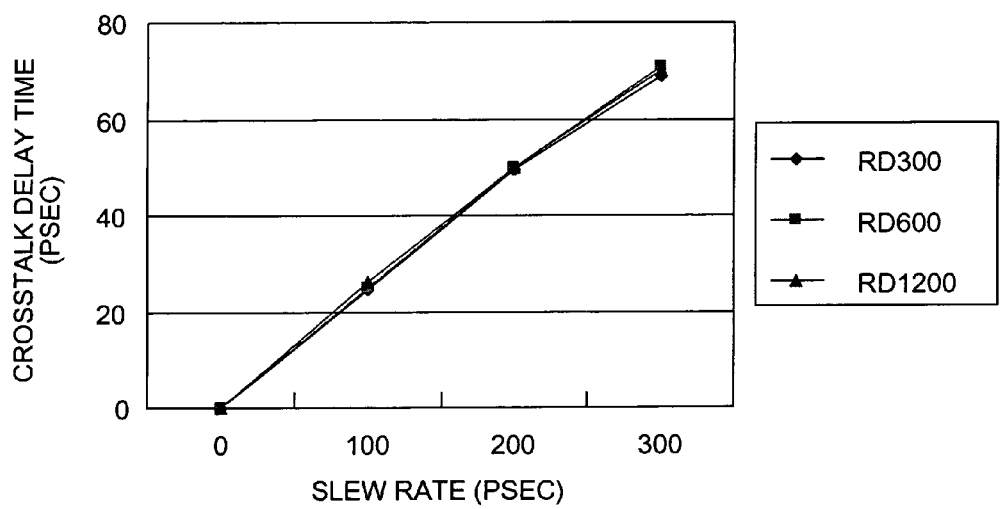
FIG. 3 is a graph of a correlation between a delay time caused due to the crosstalk in the circuit model and a slew rate that indicates an input waveform into an input terminal of a cell in the circuit model.

FIG. 3 is a graph of a correlation between the crosstalk delay time in the circuit model 200 and the slew rate that indicates an input waveform into the input terminals of the driver cell 212 and the receiver cell 213 in the circuit model 200. In the graph shown in FIG. 3, the slew rate is plotted on a horizontal axis, and the crosstalk delay time obtained from the victim net 211 is plotted on a vertical axis. In FIG. 3, the correlation is shown when an internal resistance RD that indicates the driving capacity of the driver cell 202 in the aggressor net 201 is 300 Ω, 600 Ω, and 1200 Ω. Linear interpolation is applied between plotted points.

Figure 4:
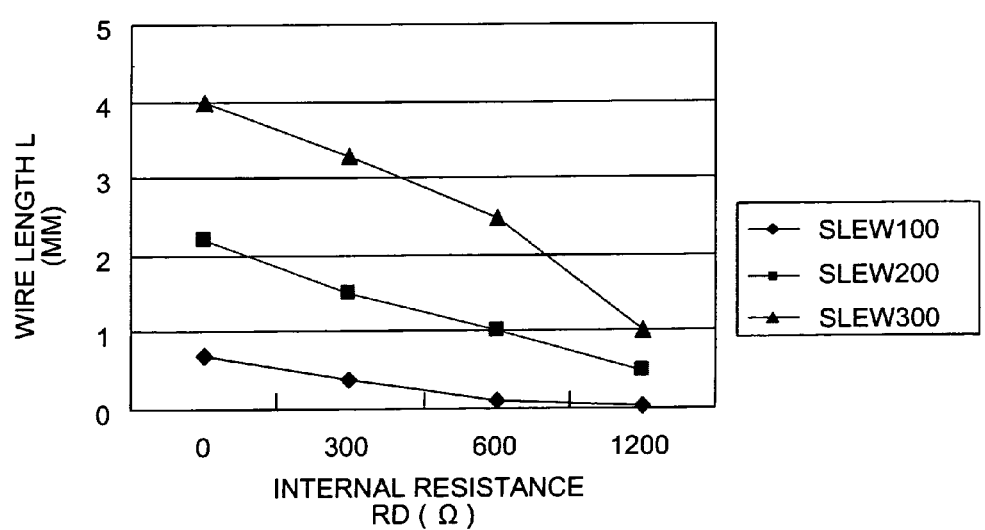
FIG. 4 is a graph of a correlation between an internal resistance in the cell in the circuit model and a wire length of a wiring that connects the cells.

FIG. 4 is a graph of a correlation between the internal resistance of the driver cell 202 and the wire length of the wiring that connects the receiver cell 203 in the circuit model and the wire length of the aggressor line 205 between the driver cell 202 and the receiver cell 203. In the graph shown in FIG. 4, the internal resistance RD is plotted on a horizontal axis, and the wire length of the aggressor line 205 is plotted on a vertical axis. In FIG. 4, the correlation is shown when a slew rate SLEW of the victim net 211 is 100 picoseconds (psec), 200 psec, and 300 psec. The linear interpolation is applied between plotted points.

FIG. 5 is a correlation table 500 of the internal resistance RD, a wire length (information) L of the aggressor line 205, and the slew rate SLEW of the victim net 211. The correlation table 500 is created based on the graphs shown in FIGS. 3 and 4.

Figure 6:
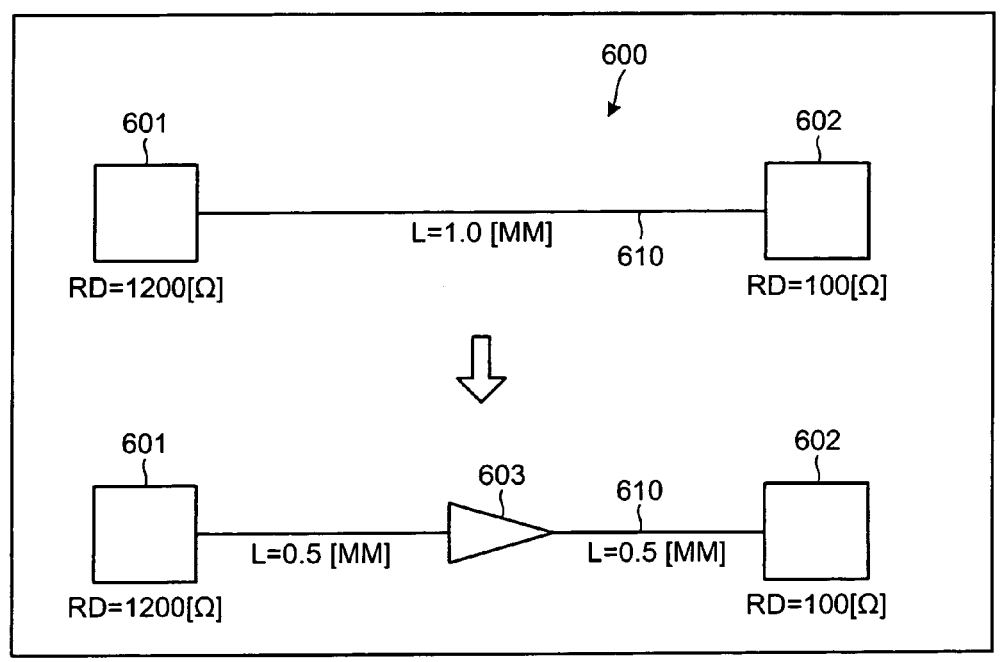
FIG. 6 is a schematic of arrangement of a buffer using the correlation table.

FIG. 6 is a schematic of arrangement of the buffer using the correlation table 500. As shown in FIG. 6, a target net 600 includes a driver cell 601, a receiver cell 602, and a wiring line 610 that connects the driver cell 601 and the receiver cell 602.

If the crosstalk delay time that is acceptable is, for example, 50 or less psec, when the internal resistance RD of the driver cell 601 is 1200 Ω, it is determined that the slew rate is 200 psec based on the correlation table 500. Moreover, it is determined that the wire length is 0.5 mm based on the graph shown in FIG. 4 and the correlation table 500.

The wire length of 0.5 mm is a wire length that satisfies a condition that even if the crosstalk delay time is caused, the crosstalk delay time is an acceptable amount in the layout designing. The wire length thus obtained from the correlation table 500 and the wire length of the wiring line 610 is compared. When the wire length of the wiring line 610 is longer than the wire length obtained from the correlation table 500, a buffer 603 is arranged on the wiring line 610 at a position that is 0.5 mm, which is the wire length obtained from the correlation table 500, away from the driver cell 601.

The internal resistance RD that is the driving capacity of the buffer 603 is 1200 Ω that corresponds to the wire length of 0.5 mm based on the correlation table 500. The slew rate SLEW of the buffer 603 is 200 psec that corresponds to the wire length of 0.5 mm based on the correlation table 500.

Figure 7:
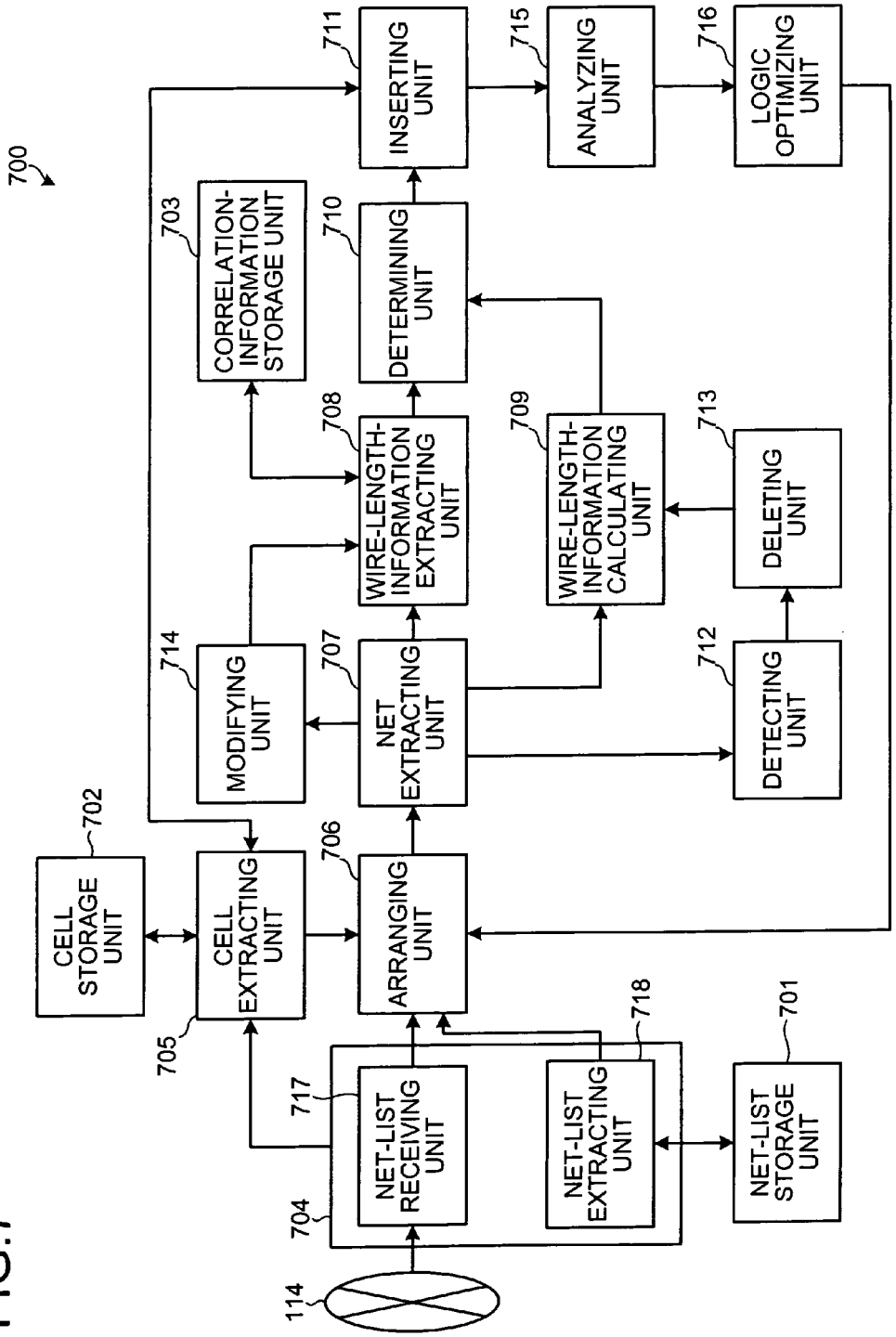
FIG. 7 is a block diagram of a functional configuration of the layout designing apparatus.

FIG. 7 is a block diagram of a functional configuration of a layout designing apparatus 700 according to the embodiment of the present invention. As shown in FIG. 7, the layout designing apparatus 700 includes a net-list storage unit 701, a cell storage unit 702, a correlation-information storage unit 703, a net-list input unit 704, a cell extracting unit 705, an arranging unit 706, a net extracting unit 707, a wire-length-information extracting unit 708, a wire-length-information calculating unit 709, a determining unit 710, an inserting unit 711, a detecting unit 712, a deleting unit 713, a modifying unit 714, an analyzing unit 715, and a logic optimizing unit 716.

The net-list storage unit 701 stores a net list that is provided by a user. The net list indicates a circuit connection in, for example, a standard text format called "electronic design interchange format (EDIF)".

The cell storage unit 702 stores cells that are arranged in an LSI chip. Specifically, the cell storage unit 702 is formed with a cell library. The cells stored in the cell library includes an AND circuit, an OR circuit, and a microcell such as the inverter, the buffer, a feed forward (FF), the RAM, and a phase-locked loop (PLL). Each of the cells has information on a type and a number of terminals, such as the input terminal and the output terminal, the internal resistance, and the slew rate.

The correlation-information storage unit 703 stores correlation information that indicates correlation between information on the driving capacity of each of the cells in the circuit model 200, and information on the wire length of a wiring that connects the cells. The correlation information is created based on the crosstalk delay time that is caused as a result of a circuit simulation with the circuit model 200 in which the crosstalk occurs. The correlation information corresponds to the correlation table 500 shown in FIG. 5. The correlation information indicates the correlation between the internal resistance RD of the driver cell 202, the receiver cell 203, the driver cell 212, and the receiver cell 213 and the wire length information L of the wiring lines 205 and 215.

Specifically, the net-list storage unit 701, the cell storage unit 702, and the correlation-information storage unit 703 can be implemented with a writable recording medium such as the RAM 103, the HD 105, and the FD 107 shown in FIG. 1.

The net-list input unit 704 includes a net-list receiving unit 717 and a net-list extracting unit 718. The net-list receiving unit 717 receives the net-list from an external storage unit (not shown) via the network 114 shown in FIG. 1. The net-list extracting unit 718 extracts the net list from the net-list storage unit 701 in accordance with an operation by the keyboard 110 and the mouse 111 shown in FIG. 1. Thus, an arbitrary net list is input.

The cell extracting unit 705 extracts a cell that matches specification in the net list input by the net list input unit 704 from the cell storage unit 702. Specifically, since a name of the cells and information on terminal connection are specified in the net list, the cell extracting unit 705 extracts the cell that matches the name of the cell and the information on the terminal connection from the cell storage unit 702, which is the cell library. Moreover, when the cell extracting unit 705 receives a request to acquire a cell from the inserting unit 711, the cell extracting unit 705 extracts a cell that matches the request. Extraction of the cell in response to the inserting unit 711 will be explained later.

The arranging unit 706 arranges the cell obtained from the net list that is input by the net-list input unit 704 on the LSI chip. Specifically, the arrangement of the cells is carried out based on connecting relationship of the net list. More specifically, the LSI chip is partitioned into a plurality of lattices, and a global arrangement of the cell is performed in each of the lattices. Then, detailed arrangement in each of the lattices is performed.

The net extracting unit 707 extracts an arbitrary net to be a test target from a cluster of the cell arranged by the arranging unit 706. The net extracted is the target net and is formed with a driver cell and a receiver cell.

The wire-length-information extracting unit 708 extracts wire length information that correlates with the information on the driving capacity of the cell in the net extracted from among the correlation information stored in the correlation-information storage unit 703. Specifically, the wire-length-information extracts wire length information L that correlates with the internal resistance RD, which is the information relating to the driving capacity of the cell in the target net. For example, the driver cell is the driver cell 601 shown in FIG. 6, and the receiver cell is the receiver cell 602 shown in FIG. 6. The wire length information L of the driver cell 601 in the target net 600 is extracted by a method explained with FIG. 6.

Figure 8:
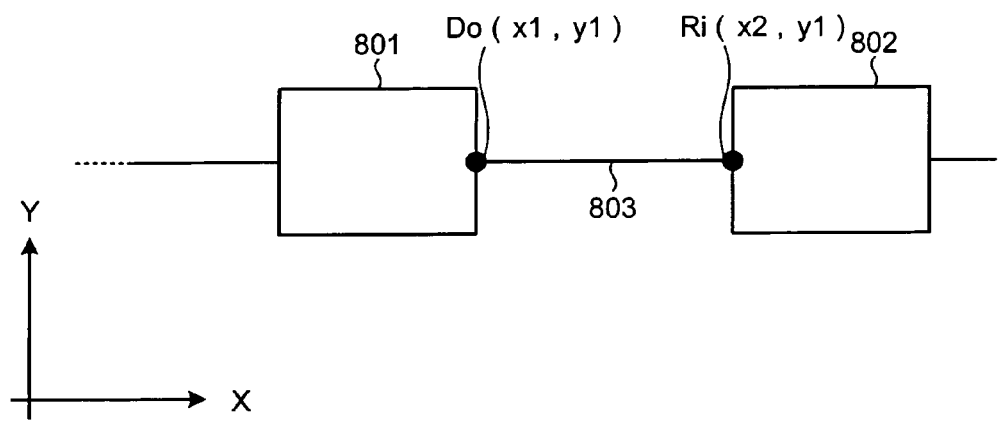
FIG. 8 is a schematic of calculation for wire length information by a wire-length-information calculating unit.
Figure 9:
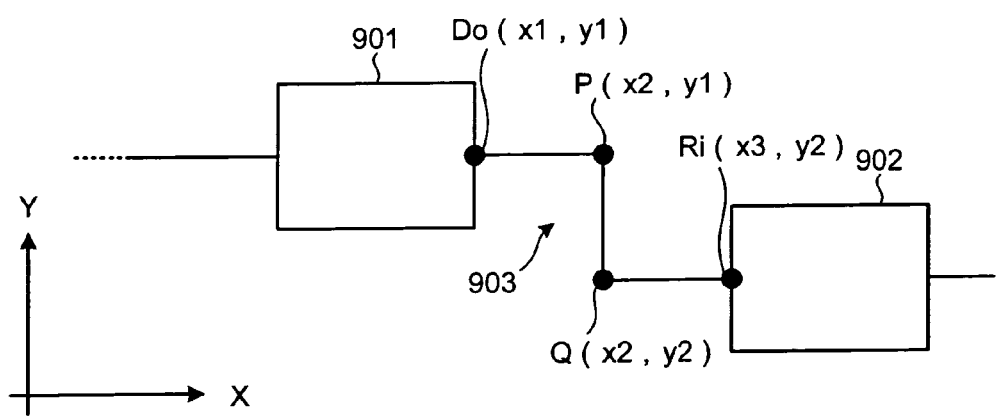
FIG. 9 is a schematic of another calculation for the wire length information.

The wire-length-information calculating unit 709 calculates the wire length information of the wiring between the driver cell and the receiver cell in the target net. Specifically, the wire-length-calculating unit 709 calculates the wire length information based on a position of a coordinate of the output terminal of the driver cell and a position of a coordinate of the input terminal of the receiver cell on the LSI chip. The wiring on the LSI chip is routed along an X axis and a Y axis that cross with each other perpendicularly. FIGS. 8 and 9 are schematics of the calculation for the wire length information performed by a wire-length-information calculating unit 709.

In a case shown in FIG. 8, a value of the coordinate of an output terminal Do of a driver cell 801 is (x1, y1), and a value of the coordinate of an input terminal Ri of a receiver cell 802 is (x2, y1). Because the value of the Y coordinates are same, the wire length information L of a wiring line 803 is calculated from a differential between the values of the X coordinate of the output terminal Do and the input terminal Ri.

On the other hand, in a case shown in FIG. 9, a wiring line 903 that connects a driver cell 901 and a receiver cell 902 is not a straight line along either of the X axis or the Y axis. The wiring line 903 arranged from an output terminal Do (x1, y1) of the driver cell 901 to an input terminal Ri (x3, y2) of the receiver cell 902 is bent at a point P (x2, y1) and a point Q (x2, y2). Therefore, the wire length information L of the wiring line 903 is calculated from a total value that is obtained by adding each of distances between the point Do and the point P, the point P and the point Q, and the point Q and the point Ri.

The determining unit 710 shown in FIG. 7 determines whether the net extracted by the net extracting unit 707 causes the crosstalk based on the wire length information extracted by the wire-length-information extracting unit 708. Specifically, the determining unit 710 determines whether the net causes the crosstalk based on the wire length information extracted from the correlation table 500 and the wire length information calculated by the wire-length-information calculating unit 709.

For example, suppose that the wire length of the target net 600 shown in FIG. 6 is a wire length information Lb that is calculated by the wire-length-information calculating unit 709, when a wire length information La that is extracted from the correlation table 500 is smaller in value than the wire length information Lb, it is determined that the target net 600 causes the crosstalk. On the other hand, when the wire length information La is larger in value than the wire length information Lb, it is determined that the target net 600 does not cause the crosstalk.

The detecting unit 712 detects whether a delay-time suppressing cell, such as the buffer or the inverter, is included in the net extracted by the net extracting unit 707. Specifically, the buffer or the inverter that is arranged between the driver cell and the receiver cell is detected. More specifically, the name of the cell arranged is detected.

Figure 10:
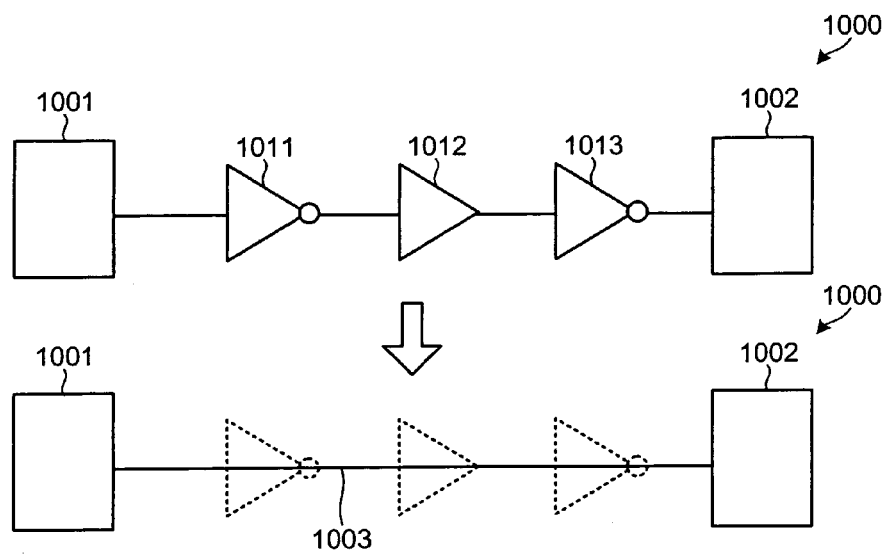
FIG. 10 is a schematic of a target net in which a delay-time suppressing cell is detected by a detecting unit, and the target net from which the delay-time suppressing cell is removed.

When the detecting unit 712 detects such delay-time suppressing cell included, the deleting unit 713 deletes the delay-time suppressing cell from the net. FIG. 10 is a schematic of a target net in which the delay-time suppressing cell is detected by the detecting unit 712, and the target net from which the delay-time suppressing cell is removed.

As shown in FIG. 10, a buffer 1012 and inverters 1011 and 1013 that are detected by the detecting unit 712 are deleted by the deleting unit 713. The wire-length-information calculating unit 709 calculates the wire length information L of a wiring line 1003 between a driver cell 1001 and a receiver cell 1002 in a target net 1000 from which the buffer 1012 and the inverters 1011 and 1013 are deleted.

The modifying unit 714 modifies information on a driving capacity of the driver cell in the net extracted by the net extracting unit 707 to improve the driving capacity. Specifically, for example, the internal resistance RD of the driver cell is used as the driving capacity of the driver cell. When the value of the internal resistance RD is high, the driving capacity is low, and when the value of the internal resistance RD is low, the driving capacity is high.

The modifying unit 714 determines whether the internal resistance RD of the driver cell is equal to or more than a predetermined value. When it is determined that the value of the internal resistance RD is equal to or more than the predetermined value, the modifying unit 714 modifies the internal resistance RD to be lower. For example, the modifying unit 714 reduces the value of the internal resistance RD by ½ to double the driving capacity.

Suppose that the predetermined value is 1000 Ω and the wire length information L is 0.8 mm. If the internal resistance RD of the driver cell is 1200 Ω, the wire length information L extracted from the correlation table 500 is 0.5 mm, and is smaller in value than the wire length information L of the target net. Therefore, it is necessary to insert the buffer. When the modifying unit 714 reduces the internal resistance RD by ½ to 600 Ω, the wire length information L extracted from the correlation table 500 is 1.0 mm, and is larger in value than the wire length 0.8 mm of the net. Therefore, the buffer is not necessary.

The inserting unit 711 inserts the delay-time suppressing cell, such as the buffer and the inverter, which inhibits occurrence of the crosstalk delay time in the net based on the wire length information extracted by the wire-length-information extracting unit 708. Specifically, as shown in FIG. 6, the wire length information L (La) obtained from the correlation table 500 and the wire length information L (Lb) of the wiring line 610 in the target net 600 are compared. When the wire length information La is smaller in value than the wire length information Lb, the buffer is inserted in the target net 600 on the wiring line 610 at a position away for a distance of the wire length information La from the driver cell 601.

Figure 11:
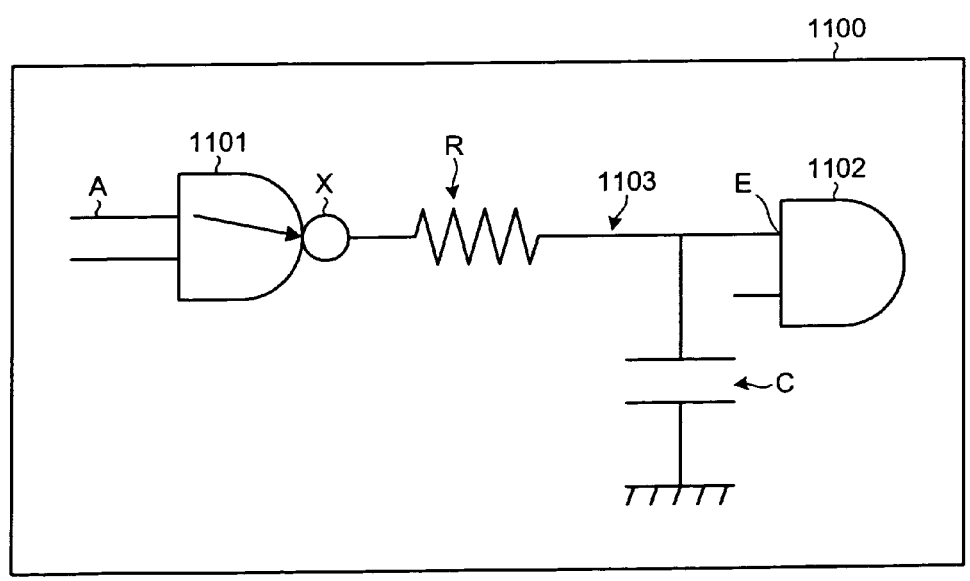
FIG. 11 is a schematic of a delay model that is used in a timing analysis.

The analyzing unit 715 performs a timing analysis on the target net in which the delay-time suppressing cell is inserted by the inserting unit 711. Specifically, the analyzing unit 715 performs the timing analysis using a delay model. FIG. 11 is a schematic of a delay model 1100 that is used in the timing analysis. The delay model 1100 includes a driver cell (NAND circuit) 1101 and a receiver cell (AND circuit) 1102 that are connected through a wiring line 1103. The wiring line 1103 has a wire resistance R and a wire capacity C.

In the timing analysis, according to the delay model 1100, a delay value of natural delay in each of the driver cell 1101 and the receiver cell 1102, a delay value due to a load capacity that is connected to an output terminal, a delay value that is dependent on an input slew rate, and a delay value of due to the wiring line 1103 are calculated. Then, the delay values calculated are analyzed whether the values satisfy a timing constraint.

For the timing analysis, it is necessary that parameters required for calculation of the delay are defined in a delay library. The calculation is carried out using the parameters defined and a formula for the calculation of the delay. For example, a delay value Dax caused in the driver cell 1101 between an input terminal A and an output cell X is calculated by adding four delay values (a) to (d) as shown in a following formula (1).

$$Dax=(a)+(b)+(c)+(d) \quad (1)$$

where (a) is the delay value of a delay relating to the input slew rate, and indicates the delay due to inclination of an input waveform; (b) is the delay value of the natural delay in the cell, and indicates the natural delay of the cell under no load without a net connected to the cell; (c) is the delay value of the delay due to the load capacity, and indicates the delay caused due to influence of a drive and the load capacity of the output terminal; and (d) is the delay value of the delay due to the wiring, and indicates the delay caused when the transmission signal is transferred on the wiring line 1103.

In this example, the delay in an Elmore delay model that is expressed by a product of the wire resistance R and the wire capacity C is used. For a large-scale LSI having a complicated timing, a delay cannot be expressed by a simple formula like the formula (1), and more complicated formula is used in an actual situation. In the delay library, by registering the values of the formula (1) as, for example, a two-dimensional table, the delay model 1100 can be expressed. In the delay library, other parameters required for the calculation, such as the name of the cells, a name of a path, the driving capacity, a power type, and a pin capacity, are also stored, and are used for the calculation.

Figure 12:
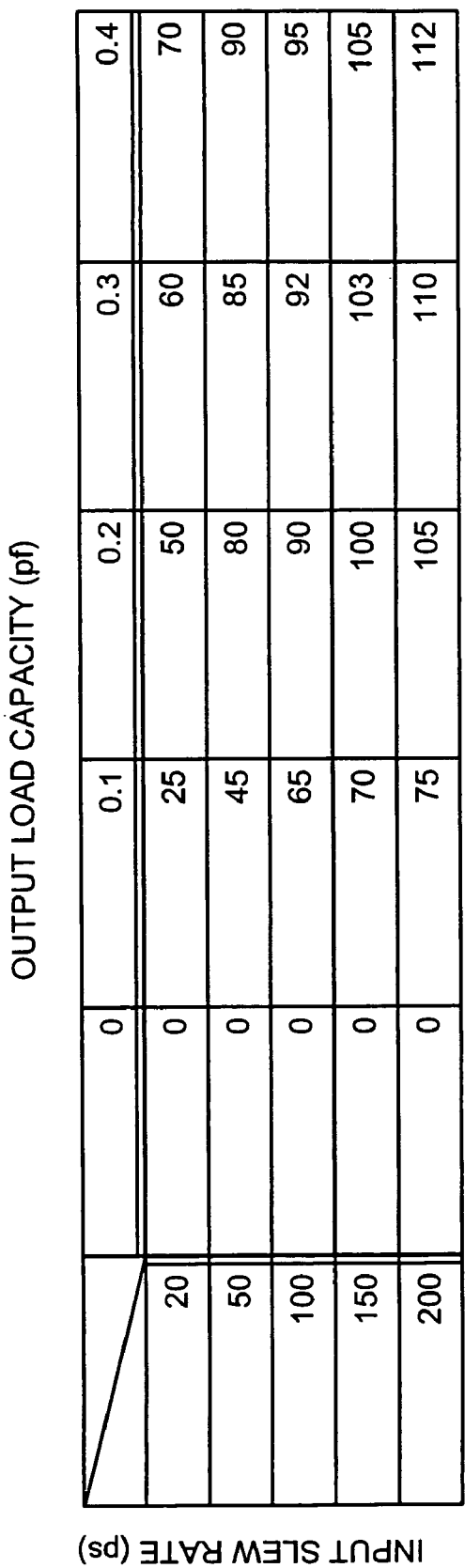
FIG. 12 is a two-dimensional table that is stored in a delay library.

FIG. 12 is a two-dimensional table that is stored in the delay library. Using the two-dimensional table, the delay value (b) of the natural delay in the cell can be obtained by providing the input slew rate and an output load capacity.

For example, in the example shown in FIG. 11, the delay value from the input terminal A through the output terminal X to the input terminal E of the receiver cell 1102 is calculated by adding the delay value that is obtained from the two-dimensional table shown in FIG. 12 based on the input slew rate of the transmission signal that is input into the input terminal A and the load capacity that is connected to the output terminal, and the a wire delay value of R×C in the Elmore delay.

Figure 13:
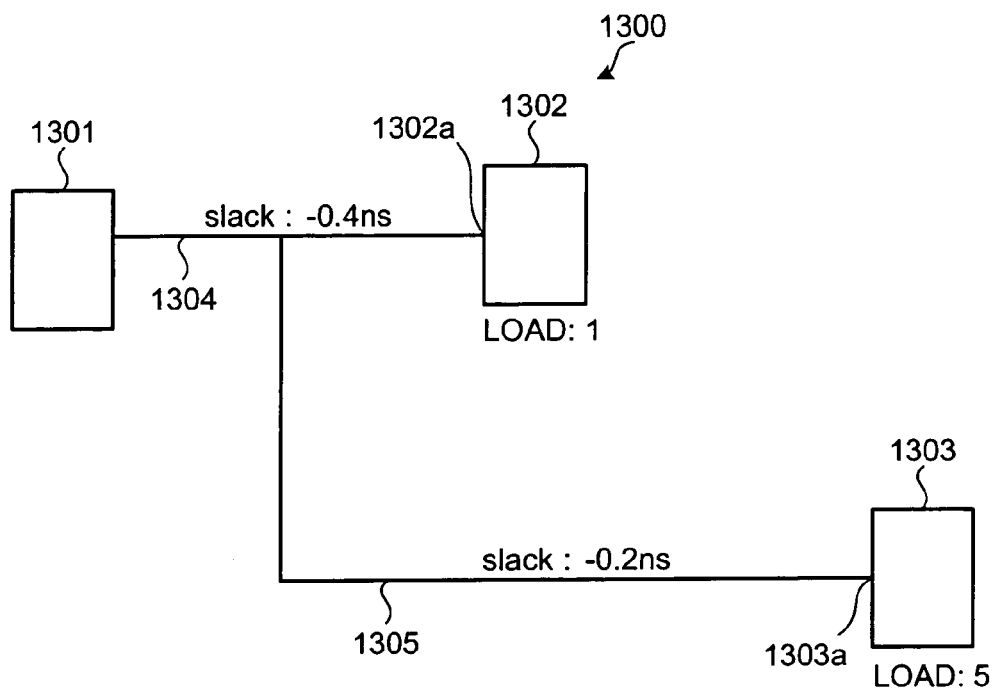
FIG. 13 is a schematic of a target net in which a timing error occurs.
Figure 14:
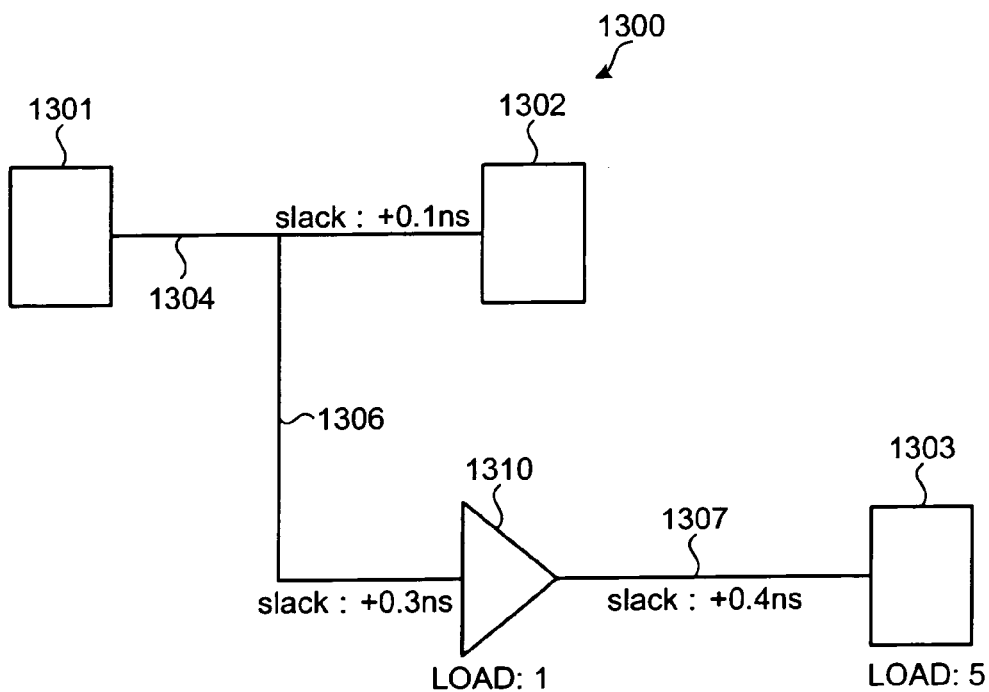
FIG. 14 is a schematic of the target net shown in FIG. 13 of which a logic is optimized.

The analyzing unit 715 analyzes whether a timing error occurs in the target net based on the delay value thus calculated. The logic optimizing unit 716 performs logic optimization on the target net based on a result of analysis by the analyzing unit 715. FIG. 13 is a schematic of a target net in which the timing error occurs, and FIG. 14 is a schematic of the target net shown in FIG. 13 of which a logic is optimized.

By the timing analysis, an arrival time AAT (actual arrival time) and a required time RAT (required arrival time) to an input terminals 1302*a* and 1303*a* are calculated for each of the input terminals 1302*a* and 1303*a* of the receiver cells 1302 and 1303 in the target net 1300. Then a slack is calculated by subtracting the arrival time AAT from the required time RAT.

When the slack calculated is a negative value, it signifies that the timing error occurs in the target net 1300. For example, as shown in FIG. 13, if a path 1304 between a cell 1301 and the receiver cell 1302 of which a load is "1" is a critical path of which the slack is −0.4 nanoseconds (ns), it is determined that the timing error occurs in the path 1304.

Moreover, if the slack of a path 1305 between the cell 1301 and the receiver cell 1303 of which the load is "5" is −0.2 ns, it is determined that the timing error occurs also in the path 1305. A total load when the cell 1301 is used as the driver cell is "6", which is acquired by adding the load "1" of the receiver cell 1302 and the load "5" of the receiver cell 1303.

To resolve the timing error that occurs in the paths 1304 and 1305, a buffer 1310 of which the load is "1" is inserted in the path 1305 between the cell 1301 and the receiver cell 1303. As shown in FIG. 14, after inserting the buffer 1310, the total load when the cell 1301 is used as the driver cell becomes "2", which is acquired by adding the load "1" of the receiver cell 1302 and the load "1" of the buffer 1310.

Because of reduction in the total load, the slack between the cell 1301 and the receive cell 1302 changes to a positive value of +0.1 ns from −0.4 ns. Furthermore, although the slack between the cell 1301 and the receiver cell 1303 is −0.2 ns in FIG. 13, after inserting the buffer 1310, the slack of a path 1306 between the cell 1301 and the buffer 1310 becomes a positive value of +0.3 ns, and the timing error in the path 1306 can be resolved as shown in FIG. 14. Similarly, the slack of a path 1307 between the buffer 1310 and the receiver cell 1303 becomes a positive value of +0.4 ns, and the timing error in the path 1307 can be resolved.

The net-list input unit 704, the cell extracting unit 705, the arranging unit 706, the net extracting unit 707, the wire-length-information extracting unit 708, the wire-length-information calculating unit 709, the determining unit 710, the inserting unit 711, the detecting unit 712, the deleting unit 713, the modifying unit 714, the analyzing unit 715, and the logic optimizing unit 716 can be implemented specifically by, for example, the CPU 101 executing a computer program that is stored in the ROM 102, the RAM 103, the HD 105, and the FD 107.

Figure 15:
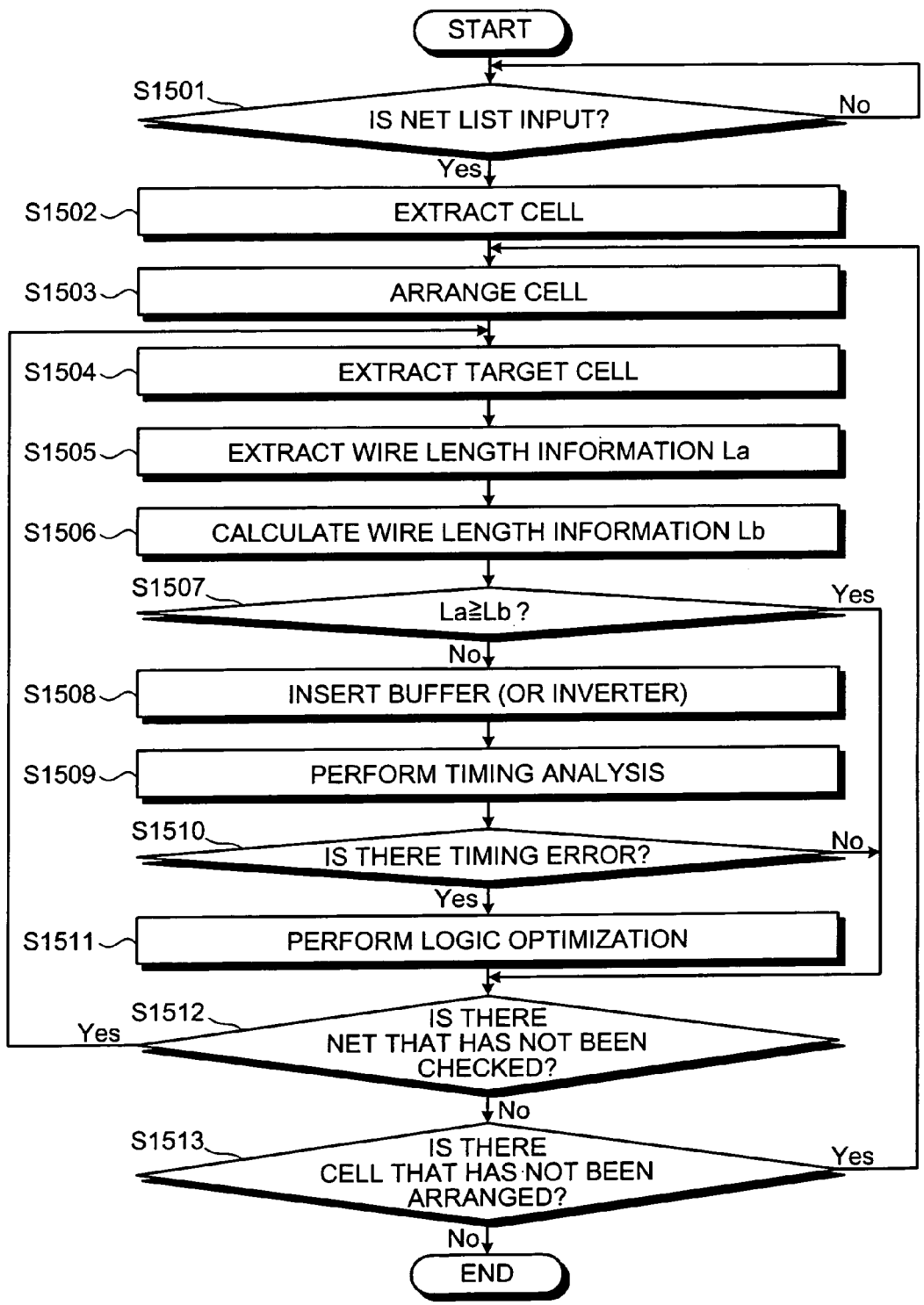
FIG. 15 is a flowchart of layout designing according to an embodiment of the present invention.

FIG. 15 is a flowchart of layout designing according to the embodiment of the present invention. It is noted that the crosstalk delay time that is acceptable is predetermined.

As shown in FIG. 15, when the net list is input ("YES" at step S1501), the cell that is described in the net list is extracted from the cell storage unit (the cell library) 702 (step S1502). Then the cell extracted is arranged on the LSI chip based on connecting relationship of the net list (step S1503).

Then, the target net is extracted from a cluster of the cell arranged on the LSI chip (step S1504). The wire length information La is extracted from the correlation table 500 based on the slew rate of the cell in the target net, the internal resistance, and the crosstalk delay time, which is predetermined (step S1505). In addition, the wire length information Lb of the target net is calculated (step S1506).

Then, it is determined whether the crosstalk occurs in the target net. In other words, it is determined whether the wire length information La is larger in value than the wire length information Lb (step S1507). When the wire length information La is larger in value than the wire length information Lb ("YES" at step S1507), it is determined that the crosstalk does not occur in the target net, and a process proceeds to a step S1512.

On the other hand, when the wire length information La is smaller in value than the wire length information Lb ("NO" at step S1507), it is determined that the crosstalk occurs in the target net. Therefore, the buffer or the inverter is inserted (step S1508) as shown in FIG. 6. Then, as shown in FIG. 13, the timing analysis is performed (step S1509). When no timing error occurs in the target net ("NO" at step S1510), the process proceeds to the step S1512

On the other hand, when the timing error occurs in the target net ("YES" at step S1510), the logic optimization is performed (step S1511) as shown in FIG. 14 to resolve the timing error. Then, it is determined whether there is a net that has not been checked yet (step S1512). If there is the net that has not been checked ("YES" at step S1512), the process returns to the step S1504, and the net is extracted as the target net.

When all the net has been checked ("NO" at step S1512), it is then, determined whether there is a cell that has not been arranged yet on the LSI (step S1513). If there is the cell that has not been arranged ("YES" at step S1513), the process returns to the step S1503, and the cell is arranged on the LSI chip. On the other hand, when all the cells has been arranged ("NO" at step S1513), the process is finished.

According to the layout designing, it can be determined whether the crosstalk occurs in the target net base on the wire length across the board. Therefore, processes for searching a portion having the parallel wiring in the automatic cell arrangement, and for calculating the crosstalk delay time in the portion are not required, thereby speeding up the process in the automatic arrangement.

Figure 16:
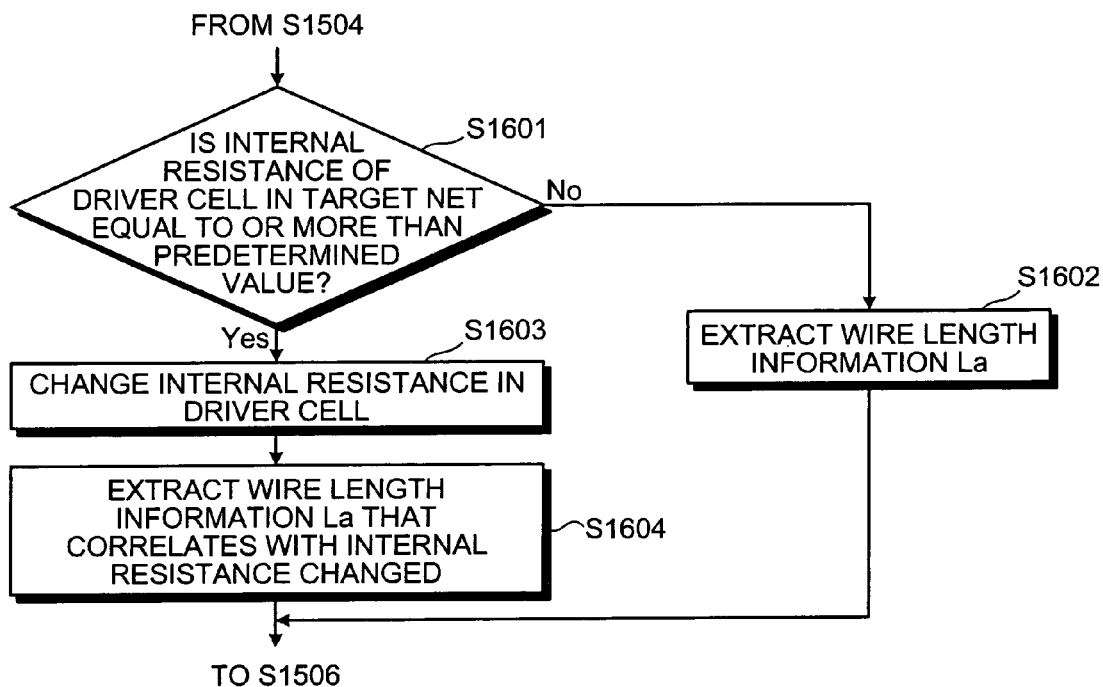
FIG. 16 is a flowchart of another layout designing according to an embodiment of the present invention.

FIG. 16 is a flowchart of another layout designing according to the embodiment. The step S1505 shown in FIG. 15 is replaced with steps S1601 to S1604 shown in FIG. 16. Other steps shown in FIG. 15 are same also in this layout designing, and explanation therefor is omitted.

After the target net is extracted at the step S1504 shown in FIG. 15, it is determined whether the value of the internal resistance in the driver cell in the target net is equal to or larger than the predetermined value (step S1601). When the value is not equal to or larger than the predetermined value ("NO" at step S1601), the wire length information La is extracted from the correlation table 500 (step S1602). Then, the process proceeds to the step S1506, and the wire length information Lb is calculated.

On the other hand, when the value of the internal resistance is larger than the predetermined value ("YES" at step S1601), the internal resistance is modified by the modifying unit 714 to improve the driving capacity of the driving cell (step S1603). Specifically, the internal resistance is reduced by ½ to double the driving capacity. The wire length information La that correlates with the internal resistance modified is extracted from the correlation table 500 (step S1604). Then, the process proceeds to the step S1506, and the wire length information Lb is calculated.

According to the layout designing, the internal resistance of the driver cell in the target net is modified before determining the occurrence of the crosstalk. Therefore, it is possible to prevent the occurrence of the crosstalk due to low driving capacity of the driver cell. Thus, it is possible to reduce the buffer and the inverter to be inserted, thereby reducing a number of parts used during manufacturing of the LSI chip, and shortening a manufacturing time.

Figure 17:
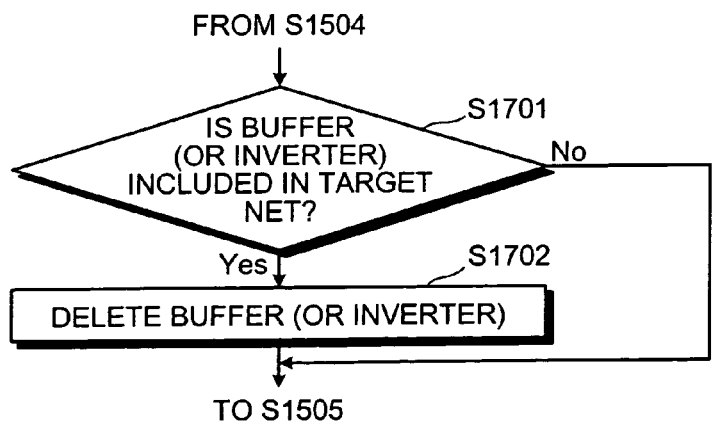
FIG. 17 is a flowchart of still another layout designing according to an embodiment of the present invention.

FIG. 17 is a flowchart of still another layout designing according to the embodiment. Steps S1701 and S1702 shown in FIG. 17 are performed between the steps S1504 and S1505 shown in FIG. 15. Therefore, other steps shown in FIG. 15 are same also in this layout designing, and explanation therefor is omitted.

After the target net is extracted at the step S1504 shown in FIG. 15, the buffer (or the inverter) that is included in the target net is detected (step S1701). When there is no buffer (or no inverter) included in the target net ("NO" at step S1701), the process proceeds to the step S1505 shown in FIG. 15, and the wire length information La is extracted.

On the other hand, when there is the buffer (or the inverter) is included in the target net ("YES" at step S1701), the buffer (or the inverter) detected in the target net is deleted (step S1702). Then, the process proceeds to the step S1505, and the wire length information La is extracted. Even if it is determined that the crosstalk occurs in the target net ("YES" at step S1507) after deleting the buffer (or the inverter), because the buffer (or the inverter) can be inserted at the step S1508, it is possible to carry out the layout designing that does not cause the crosstalk.

According to this layout designing, an unnecessary buffer (or the inverter) that does not contribute to inhibition of the crosstalk delay time is deleted before extracting the wire length information La. Therefore, it is possible to reduce a number of the buffer or the inverter to be inserted, thereby reducing the number of the parts used in manufacturing of the LSI chip, and shortening the manufacturing time.

As described above, with the layout designing apparatus, the layout designing method, the layout designing program, and the recording medium according to the embodiment of the present invention, it is possible to prevent fluctuations of the crosstalk delay time before performing detailed routing of the LSI chip, thereby reducing the fluctuations of the crosstalk delay time after the detailed routing. As a result, it is possible to reduce works of inserting the buffer to resolve violation due to the crosstalk after the detailed routing, and of rerouting to keep the space between the wirings wider, thereby shortening the TAT.

Moreover, the crosstalk delay time that is acceptable is set at a time of the automatic arrangement, and the wire length that satisfies the condition of the crosstalk delay time being acceptable is determined based on the correlation table 500. Thus, the buffer can be inserted quickly at an appropriate position. Therefore, it is possible to inhibit the crosstalk delay time without spending enormous hours on calculation in an analysis on the delay due to the crosstalk.

The layout designing method according to the embodiment of the present invention can be implemented by executing a program that is prepared in advance with a computer such as a personal computer, a workstation, and the CAD. The program is stored in a computer-readable recording medium such as the hard disk, the flexible disk, the CD-ROM, the MO, and the DVD. The program is read from the computer-readable recording medium by the computer to be executed. The program may be a transmission medium that can be transmitted via a network such as the Internet.

According to the present invention, it is possible to reduce the TAT and a number of work processes, thereby improving the work efficiency in the layout designing.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A layout designing apparatus comprising:
    a net-list input unit that receives an input of an arbitrary net list:
    an arranging unit that arranges a cell obtained from the arbitrary net list;
    a net extracting unit that extracts an arbitrary net from the cells arranged;
    a storing unit that stores correlation information indicating a correlation between first information and second information, the first information being on a driving capacity of each of cells included in a circuit model that is created based on a delay time caused by a crosstalk occurred as a result of a circuit simulation for a predetermined circuit model, the second information being on a wire length of a wiring that connects the cells in the circuit model;
    a detecting unit that detects whether the delay-time suppressing cell is included in the arbitrary net in advance;
    a deleting unit that deletes, when the detecting unit detects that the delay-time suppressing cell is included in the arbitrary net, the delay-time suppressing cell from the arbitrary net;
    an information extracting unit that extracts, based on the correlation information stored in the storing unit, the first wire-length information or the second wire-length information for the arbitrary net;
    a calculating unit that calculates third wire-length information between a driver cell and a receiver cell that are included in the arbitrary net;
    a determining unit that determines, based on the first wire-length information and the second wire-length information, whether the crosstalk occurs in the arbitrary net; and
    an inserting unit that inserts, based on a result of determination by the determining unit, a delay-time suppressing cell to suppress a delay time in the arbitrary net.

2. The layout designing apparatus according to claim 1, wherein
    the inserting unit inserts the delay-time suppressing cell in the net only when the determining unit determines that the crosstalk occurs in the arbitrary net.

3. The layout designing apparatus according to claim 1, further comprising
    a modifying unit that modifies the first information in such a manner that the driving capacity of the driver cell in the arbitrary net increases,
    wherein the information extracting unit extracts the first wire-length information that has a correlation with the driving capacity of the cell for which the first information is modified.

4. The layout designing apparatus according to claim 1, wherein
    the delay-time suppressing cell includes at least one of a buffer and an inverter.

5. The layout designing apparatus according to claim 1, further comprising:
    an analyzing unit that performs a timing analysis of the arbitrary net in which the delay-time suppressing cell is inserted; and
    a logic optimizing unit that performs a logic optimization of the arbitrary net based on a result of the timing analysis.

6. A layout designing method comprising:
    receiving an arbitrary net list;
    arranging a cell obtained from the arbitrary net list input;
    extracting an arbitrary net from the cells arranged;
    a storing unit that stores correlation information indicating a correlation between first information and second information, the first information being on a driving capacity of each of cells included in a circuit model that is created based on a delay time caused by a crosstalk occurred as a result of a circuit simulation for a predetermined circuit model, the second information being on a wire length of a wiring that connects the cells in the circuit model;
    detecting whether the delay-time suppressing cell is included in the arbitrary net;
    deleting, when the delay-time suppressing cell is included in the arbitrary net, the delay-time suppressing cell from the arbitrary net;
    extracting, based on the correlation information, the first wire-length information or the second wire-length information for the arbitrary net;
    calculating third wire-length information between a driver cell and a receiver cell that are included in the arbitrary net;
    determining, based on the first wire-length information and the second wire-length information, whether the crosstalk occurs in the arbitrary net; and
    inserting, based on a result of determining, a delay-time suppressing cell to suppress a delay time in the arbitrary net.

7. The layout designing method according to claim 6, wherein the inserting inserts the delay-time suppressing cell in the net only when the determining unit determines that the crosstalk occurs in the arbitrary net.

8. The layout designing method according to claim 6, further comprising
modifying the first information in such a manner that the driving capacity of the driver cell in the arbitrary net increases,
wherein the extracting extracts the first wire-length information that has a correlation with the driving capacity of the cell for which the first information is modified.

9. The layout designing method according to claim 6, wherein
the delay-time suppressing cell includes at least one of a buffer and an inverter.

10. The layout designing method according to claim 6, further comprising:
performing a timing analysis of the arbitrary net in which the delay-time suppressing cell is inserted; and
performing a logic optimization of the arbitrary net based on a result of the timing analysis.

11. A computer-readable recording medium that stores a layout designing program for designing a layer, wherein the layout designing program makes a computer execute
receiving an input of an arbitrary net list;
arranging a cell obtained from the arbitrary net list;
extracting an arbitrary net from the cells arranged;
storing correlation information indicating a correlation between first information and second information, the first information being on a driving capacity of each of cells included in a circuit model that is created based on a delay time caused by a crosstalk occurred as a result of a circuit simulation for a predetermined circuit model, the second information being on a wire length of a wiring that connects the cells in the circuit model;
detecting whether the delay-time suppressing cell is included in the arbitrary net;
deleting, when the delay-time suppressing cell is included in the arbitrary net, the delay-time suppressing cell from the arbitrary net;
extracting, based on the correlation information, the first wire-length information or the second wire-length information for the arbitrary net;
calculating third wire-length information between a driver cell and a receiver cell that are included in the arbitrary net;
determining, based on the first wire-length information and the second wire-length information, whether the crosstalk occurs in the arbitrary net; and
inserting, based on a result of determining, a delay-time suppressing cell to suppress a delay time in the arbitrary net.

12. The computer-readable recording medium according to claim 11, wherein
the inserting inserts the delay-time suppressing cell in the net only when the determining unit determines that the crosstalk occurs in the arbitrary net.

13. The computer-readable recording medium according to claim 11, further comprising
modifying the first information in such a manner that the driving capacity of the driver cell in the arbitrary net increases,
wherein the extracting extracts the first wire-length information that has a correlation with the driving capacity of the cell for which the first information is modified.

14. The computer-readable recording medium according to claim 11, wherein
the delay-time suppressing cell includes at least one of a buffer and an inverter.

15. The computer-readable recording medium according to claim 11, further comprising:
performing a timing analysis of the arbitrary net in which the delay-time suppressing cell is inserted; and
performing a logic optimization of the arbitrary net based on a result of the timing analysis.

16. A layout design apparatus for designing a chip in which crosstalk delay in an arbitrary net is reduced to an acceptable level, comprising:
a deleting unit that deletes a cell between a driver cell and a receiver cell of a target net arranged on the chip;
a calculating unit that calculates a length of a wire between the driver cell and the receiver cell;
an inserting unit that inserts a cell between the driver cell and the receiver cell when the length of the wire is larger than a threshold that is obtained by a crosstalk simulation of a circuit model including an aggressor net and a victim net,
wherein the threshold is a length of a wire between a driver cell and a receiver cell of the victim net when crosstalk delay in the victim net is at the acceptable level.

17. The layout designing apparatus according to claim 16, further comprising:
a changing unit that changes driving capacity of the driver cell of the target net to a level,
wherein the threshold is a length of the wire between the driver cell and the receiver cell of the victim net when crosstalk delay in the victim net is at the acceptable level and driving capacity of a driver cell of the aggressor net is at the level.

18. A layout designing method for designing a chip in which crosstalk delay in an arbitrary net is reduced to an acceptable level, comprising:
deleting a cell between a driver cell and a receiver cell of a target net arranged on the chip;
calculating a length of a wire between the driver cell and the receiver cell;
inserting a cell between the driver cell and the receiver cell when the length of the wire is larger than a threshold that is obtained by a crosstalk simulation of a circuit model including an aggressor net and a victim net,
wherein the threshold is a length of a wire between a driver cell and a receiver cell of the victim net when crosstalk delay in the victim net is at the acceptable level.

19. The layout designing method according to claim 18, further comprising:
changing driving capacity of the driver cell of the target net to a level,
wherein the threshold is a length of the wire between the driver cell and the receiver cell of the victim net when crosstalk delay in the victim net is at the acceptable level and driving capacity of a driver cell of the aggressor net is at the level.

* * * * *